(12) United States Patent
Schofield et al.

(10) Patent No.: US 10,309,401 B2
(45) Date of Patent: Jun. 4, 2019

(54) VACUUM EXHAUST SYSTEM AND CHANNEL-SWITCHING VALVE USED IN THIS VACUUM EXHAUST SYSTEM

(71) Applicant: Edwards Limited, Burgess Hill, Sussex (GB)

(72) Inventors: Nigel Paul Schofield, Burgess Hill (GB); Andrew Seeley, Clevedon (GB); Katsumi Nishimura, Chiba (JP); Katsunori Takahashi, Chiba (JP)

(73) Assignee: Edwards Limited, Burgess Hill (GB)

( * ) Notice: Subject to any disclaimer, the term of this patent is extended or adjusted under 35 U.S.C. 154(b) by 33 days.

(21) Appl. No.: 15/541,085

(22) PCT Filed: Jan. 6, 2016

(86) PCT No.: PCT/GB2016/050019
§ 371 (c)(1),
(2) Date: Jun. 30, 2017

(87) PCT Pub. No.: WO2016/110695
PCT Pub. Date: Jul. 14, 2016

(65) Prior Publication Data
US 2018/0003178 A1    Jan. 4, 2018

(30) Foreign Application Priority Data

Jan. 6, 2015 (GB) .................. 1500133.2

(51) Int. Cl.
*C23C 16/44* (2006.01)
*F04C 25/02* (2006.01)
(Continued)

(52) U.S. Cl.
CPC .......... *F04C 25/02* (2013.01); *C23C 16/4405* (2013.01); *C23C 16/4412* (2013.01);
(Continued)

(58) Field of Classification Search
CPC ...... F04C 27/00; F04C 2220/30; F04C 25/02; H01L 21/67155
See application file for complete search history.

(56) References Cited

U.S. PATENT DOCUMENTS

| 4,021,898 A | * | 5/1977 | Willis | ...................... H03H 3/04 |
| | | | | 219/121.62 |
| 5,114,316 A | * | 5/1992 | Shimizu | ................ F04B 37/085 |
| | | | | 417/423.4 |

(Continued)

FOREIGN PATENT DOCUMENTS

| CN | 101922437 A | 12/2010 |
| GB | 2437968 A | 11/2007 |

(Continued)

OTHER PUBLICATIONS

International Preliminary Report on Patentability from International Application No. PCT/GB2016/050019, dated Jul. 11, 2017, 7 pp.

(Continued)

*Primary Examiner* — Angelisa L. Hicks
(74) *Attorney, Agent, or Firm* — Shumaker & Sieffert, P.A.

(57) ABSTRACT

A vacuum exhaust system which exhausts gas from chambers and which comprises a plurality of branch channels for the exhaustion of the gas from the chambers, a main pipeline in the form of a confluence of the plurality of branch channels, channel open-close valves fitted to correspond with each of the said plurality of branch channels, a channel-switching valve connecting the main channel and a plurality of selection channels and allowing flow between the main channel and any one of the plurality of selection channels, a first pump which functions as a gas exhaust means in the molecular flow region of the gas and is fitted to one of the plurality of branch channels, and second pumps which function as gas exhaust means in the viscous flow region of the gas and are fitted to the plurality of selection channels.

4 Claims, 2 Drawing Sheets

(51) Int. Cl.
*H01L 21/67* (2006.01)
*F04C 23/00* (2006.01)
*H01L 21/205* (2006.01)
*F16K 15/00* (2006.01)

(52) U.S. Cl.
CPC .......... *F04C 23/001* (2013.01); *F04C 23/003* (2013.01); *H01L 21/205* (2013.01); *H01L 21/67155* (2013.01); *F04C 2220/30* (2013.01); *F16K 15/00* (2013.01)

(56) References Cited

U.S. PATENT DOCUMENTS

| | | |
|---|---|---|
| 5,733,104 A | 3/1998 | Conrad et al. |
| 6,383,300 B1 * | 5/2002 | Saito .................... C23C 16/345 118/715 |
| 6,736,606 B1 * | 5/2004 | Ohmi .................... F04D 19/04 417/244 |
| 2004/0191079 A1 | 9/2004 | Ohmi et al. |

FOREIGN PATENT DOCUMENTS

| | | |
|---|---|---|
| JP | H01159475 A | 6/1989 |
| JP | 3564069 B2 | 9/2004 |
| JP | 2010167338 A | 8/2010 |
| WO | 2006097679 A1 | 9/2006 |
| WO | 2008017880 A1 | 2/2008 |

OTHER PUBLICATIONS

British Search Report dated Jun. 25, 2015 for corresponding British Application No. GB1500133.2.
PCT Search Report and Written Opinion dated Feb. 29, 2016 for corresponding PCT Application No. PCT/GB2016/050019.
Office Action, and translation thereof, from counterpart Chinese Application No. 201680005146.2, dated Jul. 4, 2018, 20 pp.

* cited by examiner

VACUUM EXHAUST SYSTEM AND CHANNEL-SWITCHING VALVE USED IN THIS VACUUM EXHAUST SYSTEM

CROSS-REFERENCE TO RELATED APPLICATION

This Application is a Section 371 National Stage Application of International Application No. PCT/GB2016/050019, filed Jan. 6, 2016, which is incorporated by reference in its entirety and published as WO 2016/110695 A1 on Jul. 14, 2016 and which claims priority of British Application No. 1500133.2, filed Jan. 6, 2015.

FIELD

The embodiments relate to a vacuum exhaust system which exhausts gas from a chamber such as a process chamber used in semiconductor production plants; in particular, it relates to a system which is designed to provide a simpler structure for the overall vacuum exhaust system and also to reduce its cost.

BACKGROUND

In the prior art, used in semiconductor production plants for example, chambers installed in clean rooms are vacuum exhausted, process gases are introduced into evacuated chambers and the procedure of the reaction with the process gas is performed inside the relevant chamber.

The gas produced by the reaction with the process gas (the reaction product gas) in the said chamber and the residuum of the process gas in the said chamber are exhausted to the exterior of the said chamber by a vacuum exhaust system.

FIG. 2 is a block diagram of vacuum exhaust system of the prior art. The vacuum exhaust system S2 shown in FIG. 2 has a structure comprising a plurality of chambers 1 (1A, 1B, . . . 1n). The vacuum exhaust system which exhausts the gases from the plurality of chambers is described in, for example, JP 1-159475 (A) and JP 3564069 (A).

Since, in the vacuum exhaust system S2 shown in FIG. 2, the components of the exhaust system which exhausts gas from the first chamber 1 (1A) are identical with the components of the exhaust systems which exhaust gas from the other chambers 1 (1B, . . . 1n), only the exhaust system which exhausts gas from the first chamber 1 (1A) is described below.

The vacuum exhaust system S2, shown in FIG. 2 has a first channel 50A and second channel 50B as the channels through which gas is exhausted from the chamber 1 (1A).

A turbomolecular pump 51 which functions as a gas exhaust means for the gas molecular flow region is fitted into the upstream end of the first channel 50A. This first channel 50A is split into a first branch channel 50A-1 and second branch channel 50A-2 at a position downstream from the turbomolecular pump 51.

A combination dry pump 52 is fitted to the downstream end of the first branch channel 50A-1 to exhaust the gas produced by the reaction with the process gas (the reaction product gas) in the first chamber 1 and the residuum of the process gas in the first chamber 1.

On the other hand, a combination dry pump 53 is fitted to the downstream end of the second branch channel 50B-2 to exhaust the gas used for the cleaning of the interior of the chamber 1.

Furthermore, a dry pump 54 is fitted to the downstream end of the first channel 50A as the rough pump used when gas is initially exhausted from the chamber 1.

The said combination dry pumps 52, 53 comprise a pump body P1 such as a known screw pump, which functions as a gas exhaust means in the viscous flow region of the gas, and a so-called mechanical booster pump P2 which functions as a means of increasing the exhaustion rate in the pressure region in which the exhaustion rate of the pump body P1 is lower.

However, in the vacuum exhaust system S2, as shown in FIG. 2, during rough pumping of the chamber 1 (1A) all the valves V1, V2 and V3 fitted to the first channel 50A and branch channels (first branch channel 50A-1 and second branch channel 50B-2) are closed and the valve V4 fitted to the second channel 50B is open, so that exhaustion of gas through first channel 50A is disabled and exhaustion of gas through second channel 50B is enabled. Also, rough pumping of chamber 1 is performed through the second channel 50B, by the exhausting action of the dry pump 54.

Furthermore, in the vacuum exhaust system S2, as shown in FIG. 2, when the gas produced by the reaction with the process gas (the reaction product gas) in the chamber 1 (1A) and the residuum of the process gas in the chamber 1 are exhausted, valve 4 in the second channel 50B and valve V3 of the second branch channel 50A-2 are closed, and the valve V1 of the first channel 50A and valve V2 of the first branch channel 50A-1 are open, so that exhaustion of gas through second channel 50B and through second branch channel 50A-2 is disabled and exhaustion of gas through the first branch channel 50A-1 is enabled. Thus the gas (reaction product gas and residuum process gas) in chamber 1 is exhausted through the first channel 50A (using the first branch channel 50A-1) by the exhausting action of turbomolecular pump 51 and dry pump 52.

Furthermore, in the vacuum exhaust system S2, as shown in FIG. 2, when the gas (cleaning gas) used to clean the interior of the chamber 1 (1A) is exhausted, valve 4 in the second channel 50B and valve 2 of the first branch channel 50A-1 are closed, and the valve 1 of the first channel 50A and valve 3 of the second branch channel 50A-2 are open, so that exhaustion of gas through second channel 50B and through first branch channel 50A-1 is disabled and exhaustion of gas through the second branch channel 50A-2 is enabled. Thus, cleaning gas in chamber 1 and the turbomolecular pump 52 is exhausted through the first channel 50A (using the second branch channel 50A-2) by the exhausting action of the dry pump 53.

Since, however, with the structure of the vacuum exhaust system S2, described above, as shown in FIG. 2, since valve V2 and V3 are located immediately before, respectively, dry pump 52 and dry pump 53, the first channel 50A and second channel 52B coexist from the beginning to the end of the exhaust system as the exhaust system from the chambers 1 to dry pumps 52, 53 and 54 etc, there are the problems that the overall structure of the vacuum exhaust system S is complex and the cost is higher as a consequence.

SUMMARY

In accordance with one embodiment, a vacuum exhaust system which exhausts gas from chambers and which comprises a plurality of branch channels for the exhaustion of said gas from the said chambers, a main pipeline in the form of a confluence of the said plurality of branch channels, channel on-off valves fitted to correspond with each of the said plurality of branch channels, a channel-switching valve connecting the said main pipeline and a plurality of selection channels and allowing flow between any one of this plurality of selection channels and the said main pipeline, a first pump which functions as a gas exhaust means in the molecular flow region of the said gas, and second pumps which function as gas exhaust means in the viscous flow region of the said gas; and in that the said first pump is fitted to any of the said plurality of branch channels and the said second pumps are fitted to the said plurality of selection channels.

Further embodiments have a third pump which functions as a means of increasing the exhaust rate in the pressure region in which the exhaust rate of the said second pump is lower, and in that the said third pump is fitted to any of the said plurality of branch channels In accordance with one embodiment, there are three of the said selection channels and the said second pump may be fitted to each of the said selection channels and a said second pump fitted to any one of the said selection channels may be used during rough pumping when gas is exhausted from the said chamber and, apart from rough pumping, the said second pumps fitted to the other two said selection channels may be used as backup pumps in an immediately-usable standby state.

In accordance with some embodiments, when the said third pumps are fitted in the vicinity of the said first pumps, for the said plurality branch channels, the length of pipe for the short distance from the said first pumps to the said third pumps may be larger in diameter than the rest of the pipes of the said plurality of branch channels.

DETAILED DESCRIPTION

In accordance with some embodiments, the specific structure of the vacuum exhaust system is such that, as described above, the structure used for the channels is one in which the main channel is formed from a confluence of a plurality of branch channels and this main channel is connected to a plurality of selection channels by a channel-switching valve and any one of the said plurality of selection channels is caused to communicate with the main channel by the said channel-switching valve. Due to this, in that the plurality of branch channels is made into a single channel by the confluence pipe and channel-switching valve and in that the valves (valve V2 and valve V3 in FIG. 2) immediately before the second pumps (dry pump 52 and dry pump 53 in FIG. 2) in the system S2, are unified as a single channel-switching valve so that the total number of valves is reduced, it is possible to provide an appropriate vacuum exhaust system achieving an overall simplification of the structure of the vacuum exhaust system with reduction in cost.

Figure 1:
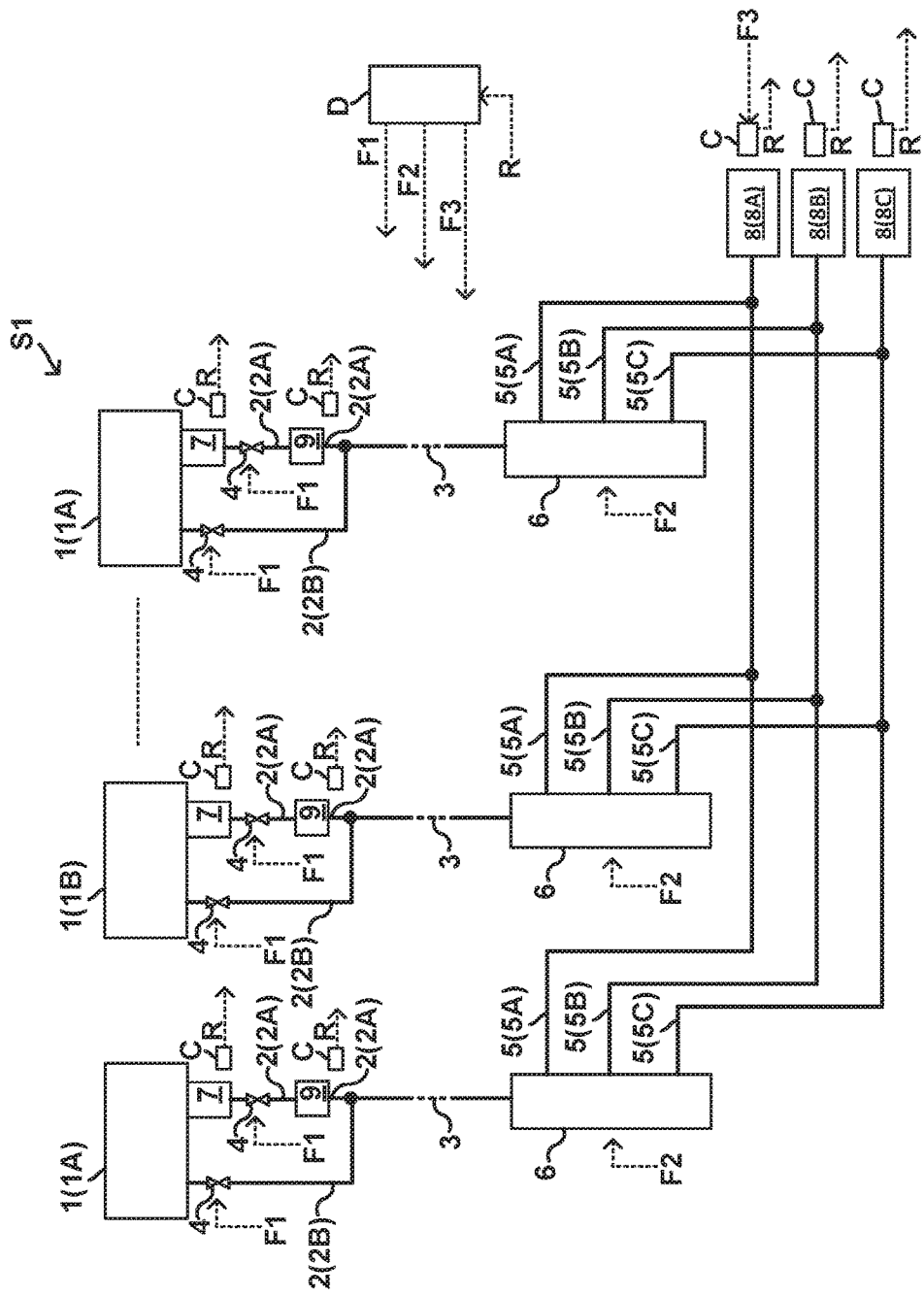
FIG. 1 is a block drawing of one embodiment of the vacuum exhaust system according to the invention.

FIG. 1 is a block drawing of one embodiment of a vacuum exhaust system S1. The vacuum exhaust system S1 shown in this figure has a structure of a system which exhausts gas from a plurality of chambers 1 (1A, 1B, ... 1n).

Figure 2:
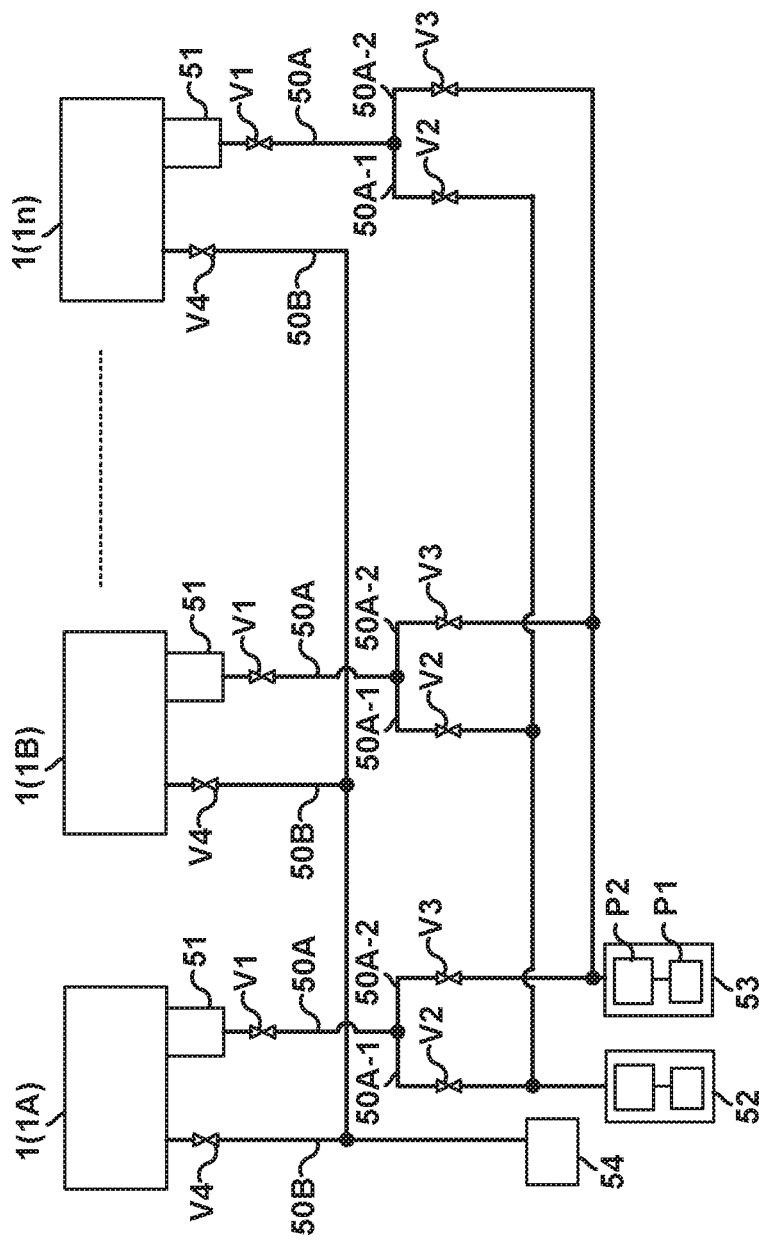
FIG. 2 is a block drawing of a prior art vacuum exhaust system.

Since, in the vacuum exhaust system S2, shown in FIG. 2, the components of the exhaust system which exhausts gas from the first chamber 1 (1A) of the plurality of chambers (1A, 1B, ... 1n) are identical with the components of the exhaust systems which exhaust gas from the other chambers 1 (1B, ... 1n), only the exhaust system which exhausts gas from the first chamber 1 (1A) is described below.

The vacuum exhaust system S1 shown in FIG. 1 is furnished with an exhaust system component which exhausts gas from the first chamber (1A) and which, as shown in the figure, comprises two branch channels 2 (2A, 2B) which exhaust gas from the chamber 1 (1A), a main channel 3 in the form of a confluence of the two branch channels 2, channel on-off valves 4 fitted one for each of the two branch channels 2, a channel-switching valve 6 which connects main channel 2 and 3 selection channels 5 (5A, 5B, 5C) and which allows any one of the selection channels 5 to communicate with the main channel 3, a first pump 7 which functions as a gas exhaustion means in the molecular flow region of the gas, second pumps 8 (8A, 8B, 8C) which function as gas exhaustion means in the viscous flow region of the gas, and a third pump 9 which functions as a means of increasing the exhaustion rate in the pressure region where the exhaustion rate of the second pumps 8 is lower. The third pump 9 may be omitted.

In the vacuum exhaust system S1 shown in FIG. 1, a first pump 7 and third pump 9 are fitted to a single branch channel 2 (2A) and one second pump 8 is fitted to each of the selection channels 5 (5A, 5B, 5C).

Chamber 1 (1A) is a vessel which may be evacuated, such as the process chambers used in semiconductor production plants and the like, and specific processes using process gas and the like are performed in chamber 1 (1A). This also true of the other chambers 1 (1B, ... 1n).

Each of the two branch channels 2 (2A, 2B) and main channel 3 are formed from pipes and, in particular, the size (diameter) of the structural pipes of branch channel 2 (2A) to which the first pump 7 and third pump 9 are fitted vary according to location.

Thus, cost reduction can be achieved, while the exhaustion capability of the first pump 7 is maintained, by forming most of the branch channel 2 (2A), to which the first pump 7 and third pump 9 are fitted, mostly from small-diameter pipes and in the vacuum exhaust system S1 shown in FIG. 1, as well as the fitting of third pump 9 near first pump 7, of the total length of the branch channel 2 (2A), the said branch channel 2 (2A) in the short length from the first pump 7 to the third pump 9 is formed from large-diameter pipes with low pipe resistance and the rest of the said branch channel 2 (2A) and main channel 3, apart from this length, is formed from small-diameter pipes. Thus, the pipes in the short length from the first pump 7 to the third pump 9 are formed from pipes of larger diameter than the rest of the piping of the plurality of branch channels 2.

Of the two branch channels 2 (2A, 2B), the gas that flows along branch channel 2 (2A) in particular is principally the residuum of the process gas used in chamber 1 and gas produced by reactions of the process gas (reaction product gas) in chamber 1. In the vacuum exhaust system shown in FIG. 1 a wire heater is wound around the outer periphery of the pipes forming the branch channel 2 (2A) and main channel 3 and the heater thus wound heats these pipes, as a means of preventing the accumulation of such gases in the branch channel 2 (2A) and main channel 3 as pressure falls.

In this case, since, in the vacuum exhaust system S1 shown in FIG. 1, as described above, most of the branch channel 2 (2A), that is, in the overall length of the branch channel 2 (2A), the part apart from the length from the first pump 7 to the third pump 9 and all of the main channel 3 are formed from small-diameter pipe, there is a reduction in the quantity of wire heater used and thus a reduction in the overall cost of the vacuum exhaust system.

Both of the channel on-off valves 4 fitted to the two branch channels 2 (2A, 2B) are structured so that they open and close the corresponding branch channel 2, on the basis of open-close control signals F1 from a control device D according to the specific timing.

When for example, gas is exhausted through the branch channel 2 (2A), in order to disable exhaustion of gas through branch channel 2 (2B) the channel open-close valve 4 of the branch channel 2 (2B) is closed, setting the branch channel 2 (2B) to a closed state, due to the output of open-close control signals F1 from the control device D to the channel open-close valve 4 of the branch channel 2 (2B), and in order to enable exhaustion of gas through branch channels 2 (2A), the channel open-close valve 4 of the branch channel 2 (2A) is opened, setting the branch channel 2 (2A) to an open state, due to the output of open-close control signals F1 from the control device D to the channel open-close valve 4 of the branch channel 2 (2A).

When, on the other hand, gas is exhausted through the branch channels 2 (2B), in order to disable exhaustion of gas through branch channels 2 (2A), the channel open-close valve 4 of the branch channel 2 (2A) is closed setting the branch channel 2 (2A) to a closed state, due to the output of open-close control signals F1 from the control device D to the channel open-close valve 4 of the branch channel 2 (2A), and in order to enable exhaustion of gas through branch channels 2 (2B), the channel open-close valve 4 of the branch channel 2 (2B) is opened, setting the branch channel 2 (2B) to an open state, due to the output of open-close control signals F1 from the control device D to the channel open-close valve 4 of the branch channel 2 (2B).

The upstream end of each of the three selection channels 5 (5A, 5B, 5C) is connected to the outlet ports of the channel-switching valves 6 described below and downstream from this they merge with the selection channels 5 (5A, 5B, 5C) from the channel-switching valves 6 of the chambers 1 (1A, 1B, . . . 1n) and are connected to the inlet ports of the second pumps 8 (8A, 8B, 8C).

The structure of the channel-switching valves 6 of each of the chambers 1 (1A, 1B, . . . 1n) is, as described above, such that they have inlet ports for connection to the downstream end of the main channels 3 described above and outlet ports for connection with each of the upstream ends of the 3 selection channels 5 (5A, 5B, 5C) and the flow from the main channels 3 is diverted into one of the selection channels 5 (5A, 5B, 5C) by a switching operation within the channel-switching valves 6. The switching operation within the channel-switching valves 6 is performed at a specified timing, based on channel-switching signals F2 from the control device D.

The structure of the first pump 7 has a gas inlet port and this gas inlet port is connected to the opening of chamber 1, so that gas may be fed into the chamber 1 through the said opening and inlet port.

Also the structure of the first pump 7 has a gas exhaust port and this exhaust port 7B is connected to the upstream end of the branch channel 2 (2A), so that gas can be exhausted from the exhaust port through the branch channel 2 (2A), towards the downstream third pump 9.

Furthermore, a controller C is fitted to the first pump 7 as a means of controlling and detecting the starting, stopping and rotational speed of the pump and other aspects of the state of the pump. A diagnostic circuit or diagnostic program is provided in the controller C which diagnoses whether there is any fault in the pump from the pump state detected and these diagnosis results R are sent from controller C to the control device D.

A previously known turbomolecular pump can be used as this type of first pump 7 but it is not thus limited. For example, a combination pump is known which has a structure comprising multiple stages of a first exhaust part functioning like a turbomolecular pump as a gas exhaustion means in the molecular flow region of the gas, and a second exhaust part functioning like a screw channel pump as a gas exhaustion means in the viscous flow region of the gas, and this combination pump may be used as the first pump 7.

The third pump 9 has a structure such that it has a gas inlet port and outlet port and, since the inlet port and outlet port are connected downstream from the first pump 7 to the same branch channel 2 (2A) as the first pump 7, the gas fed through the branch channel 2 (2A) from the first pump 7 is exhausted again towards the downstream main channel 3.

A controller C similar to that previously described for the first pump 7 may also be fitted to this third pump 9.

A known mechanical booster pump can also be used as this third pump 9. A mechanical booster pump has a structure such that two peritrochoidal rotors rotate synchronously in opposite directions in a casing to exhaust gas and this can be used as a means of increasing exhaustion rate in pressure regions in which the exhaustion rate of the second pumps 8 (8A, 8B, 8C) is lower.

All of the second pumps 8 (8A, 8B, 8C) have a gas inlet port and outlet port and the inlet port is connected to the downstream ends of the selection channels 5 (5A, 5B, 5C), so gas is fed in through the said downstream ends and inlet ports and the gas thus fed in can be exhausted from the outlet ports.

A controller C similar to that previously described for the first pump 7 may also be fitted to each of the plurality of second pumps 8 (8A, 8B, 8C).

A dry pump, such as a known screw pump in which lubricating oil is used, may be used as these second pumps 8 functioning a means of exhausting gas in regions of gas viscosity.

In the vacuum exhaust system S1 shown in FIG. 1, there are 3 selection channels 5 and one of the second pumps 8 (8A, 8B, 8C) is connected to each of the selection channels 5 (5A, 5B, 5C). A second pump 8 (8A) fitted to one selection channel 5 (5A) is used as a rough pumping pump when gas is rough pumped from the chamber 1 and, other than during rough pumping, is in an immediately-usable standby state as backup pump for the second pumps 8 (8B, 8C) fitted to the other two said selection channels 5 (5B, 5C).

Of the other second pumps 8 (8B, 8C), other than the second pump 8 (8A) which is in stand-by status to be used as a back-up pump as described above, one second pump 8 (8B) is used as a pump for the exhaustion of the process gas and gas produced by process gas reaction (reaction product gas) in the main chamber 1. The second pump 8 (8C) is used a pump for the exhaustion of gas used for the cleaning of the interior of chamber 1 and first pump 7 (cleaning gas).

The control device D comprises, for example, a personal computer furnished with system programs and hardware resources for the performance of at least the functions shown as 1 to 5 below.

Function [1]

Function 1 outputs control signals for the control of the pump state, such as starting, stopping, rotational speed and the like, to the controllers C of the first pump 7, second pumps 8 (8A, 8B, 8C) and third pump 9.

Function [2]

Function 2 outputs open-close control signals F1, to perform opening and closing, to the channel open-close valves 4.

Function [3]

Function 3 outputs channel-switching signals F2 to the channel-switching valves 6, to perform switching within the channel-switching valves 6 as described above.

Function [4]

Function 4 receives the diagnosis results R (whether the pump is normal or not) made by the diagnostic circuit and diagnostic program in the controllers C in each of the first pump 7, second pumps 8 (8A, 8B, 8C) and third pump 9.

Function [5]

Function 5 reviews the diagnosis results R received by function 4 and checks if a pump is faulty if diagnosed as abnormal. Thus, for example, when the second pump 8 (8B) is diagnosed as faulty, a process is carried out to output a channel-switching signal F2 (see 'Function 3' above) to the channel-switching valve 6 to cause the selection channel 5 (5A), which is fitted with the second pump 8 (8A) which is in standby status, as described above, to communicate with the main channel 2, and a process is carried out to output to the controller C of the second pump 8 (8A) a backup start signal F3 to switch the second pump 8(8A) from its standby state to a backup operational status. Similarly this would be the case should the second pump 8 (8C) be diagnosed as unusual.

The said 'backup operational status' here means the second pump 8 (8A) is used as a backup pump in the place of the second pump 8 (8B or 8C) in which a fault has been diagnosed.

In the vacuum exhaust system 51 shown in FIG. 1, when rough pumping is performed on the chamber 1 (1A), the channel open-close valve 4 of the branch channel 2 (2B) is opened and the channel open-close valve 4 of the branch channel 2 (2A) is closed and, further, due to the switching operation in the channel-switching valve 6, the selection channel 5 (5A) communicates with the main channel 3. Due to the exhausting operation of the second pump 8 (8A), rough pumping of the chamber 1 is performed through the branch channel 2 (2B), the main channel 3 and selection channel 5 (5A).

Also in the vacuum exhaust system 51 shown in FIG. 1, when the gas produced by reactions of the process gas (reaction product gas) in chamber 1 (1A) and the residuum of the process gas used in the chamber 1 are exhausted, the channel open-close valve 4 of the branch channel 2 (2A) is opened, and the channel open-close valve 4 of the branch channel 2 (2B) is closed and, further, due to the switching operation in the channel-switching valve 6, the selection channel 5 (5B) communicates with the main channel 3.

Also, due to the exhausting operations of the first pump 7, third pump 9 and second pump 8 (8B), the gas in the chamber 1 (reaction product gas and residuum of the process gas) are exhausted through the branch channel 2 (2A) and main channel 3.

At this time, the first pump 7 functions as a gas exhaust means in the molecular flow region of the gas and the second pump 8 (8A) functions as a gas exhaust means in the viscous flow region of the gas. Also, the third pump 9 functions as a means of increasing the exhaustion rate in the pressure region in which the exhaustion rate of the second pump 8 is lower.

Further, in the vacuum exhaust system S1 shown in FIG. 1, when the cleaning gas in the chamber 1 (1A) and first pump 7 is exhausted, the channel open-close valve 4 of the branch channel 2 (2A) is opened and the channel open-close valve 4 of the other branch channel 2 (2B) is closed and also due to the switching operations in the channel-switching valve 6, the selection channel 5 (5C) communicates with the main channel 3. It follows that, due to the exhausting operation of the second pump 8 (8C), the cleaning gas in the chamber 1 and in the first pump 7 are exhausted through the branch channel 2 (2A), main channel 3 and selection channel 5 (5C).

With this embodiment of the vacuum exhaust system S1, the system structure is such that, as described above, 2 branch channels 2 (2A, 2B) converge to form the main channel 3 and as this main channel 3 and three selection channels 5 (5A, 5B, 5C) are connected to channel-switching valve 6, one of the three selection channels 5 (5A, 5B, 5C) can be connected with the main channel 3 by this channel-switching valve 6. Thus, in that 2 branch channels 2 (2A, 2B) become joined in the confluence channel 3 and in that the valves of the previous art (valve 2 and valve 3 in FIG. 2) immediately before the second pumps (dry pump 52 and dry pump 53 in FIG. 2) are combined in a single channel-switching valve 6, and thus there is a reduction in the number and cost of valves, the overall structure of the vacuum exhaust system is simplified and the cost reduced.

The invention is not limited by the embodiment described above and many variations within the technical ideas of the present invention are possible for those skilled in the art.

In the said embodiment, the description is of two branch channels 2 and three selection channels 5 but the present invention may also apply to a structure may also be one in which there are three or more branch channels 2 and/or a structure in which there are three or more selection channels 5.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A vacuum exhaust system that exhausts gas from a chamber, the vacuum exhaust system comprising:
   a plurality of branch channels for the exhaustion of the gas from the chamber,
   a main channel formed from a confluence of the plurality of branch channels and connected to a plurality of selection channels by a channel-switching valve, wherein the channel-switching valve is configured to connect the main channel to any one of the plurality of selection channels,
   a respective channel open-close valve fitted to each branch channel of the plurality of branch channels,
   a first pump which functions as a gas exhaustion means in the molecular flow region of the gas and is fitted to any of the plurality of branch channels, and
   second pumps which function as gas exhaustion means in the viscous flow region of the gas, the second pumps fitted to the plurality of selection channels;
   wherein the selection channels comprise three selection channels and a respective one of the second pumps is fitted to each of the selection channels, and wherein one of the respective second pumps fitted to one selection channel of the plurality of selection channels is used for rough pumping of the chamber when the gas is exhausted, and wherein, apart from rough pumping, the one of the respective second pumps is otherwise kept in an immediately-usable standby state to be used as a backup pump for the other two respective second pumps respectively fitted to the other two selection channels.

2. The vacuum exhaust system according to claim 1, further comprising a third pump which functions as a means of increasing the exhaustion rate in a pressure region in which the exhaustion rate of the second pump is lower, and the third pump is fitted to any one of the plurality of branch channels.

3. The vacuum exhaust system according to claim 2, wherein
the third pump is fitted in the same branch channel as the first pump and a pipe from the first pump to the third pump is of greater diameter than other pipes in the plurality of branch channels.

4. A vacuum exhaust system for exhausting gas from a first chamber and from at least one further chamber, the vacuum exhaust system comprising:
a vacuum exhaust system for evacuating said first chamber, the vacuum exhaust system comprising:
a plurality of branch channels for the exhaustion of the gas from the chamber,
a main channel formed from a confluence of the plurality of branch channels and connected to a plurality of selection channels by a channel-switching valve, wherein the channel switching valve is configured to connect the main channel to any one of the plurality of selection channels,
a respective channel open-close valve fitted to each branch channel of the plurality of branch channels,
a first pump which functions as a gas exhaustion means in the molecular flow region of the gas and is fitted to any of the plurality of branch channels, and
second pumps which function as gas exhaustion means in the viscous flow region of the gas, the second pumps fitted to the plurality of selection channels,
at least one further plurality of branch channels for the exhaustion of the gas from the at least one further chamber,
at least one further main channel formed from the confluence of the at least one further plurality of branch channels,
a respective channel open-close valve fitted to each of the at least one further plurality of branch channels,
at least one further channel switching valve, wherein the at least one further main channel is connected to one of the plurality of selection channels via a respective at least one further channel switching valve, the respective at least one respective channel switching valve being configured to connect the at least one further main channel to any one of the plurality of selection channels,
at least one further first pump which functions as a gas exhaustion means in the molecular flow region of the gas for exhausting said at least one further chamber, and
at least one further first pump fitted to a respective any of the at least one further plurality of branch channels; wherein the selection channels comprise three selection channels and a respective one of the second pumps is fitted to each of the selection channels, and wherein one of the respective second pumps fitted to one selection channel of the plurality of selection channels is used for rough pumping of the chamber when the gas is exhausted, and wherein, apart from rough pumping, the one of the respective second pumps is otherwise kept in an immediately-usable standby state to be used as a backup pump for the other two respective second pumps respectively fitted to the other two selection channels.

* * * * *